(12) United States Patent
Davy

(10) Patent No.: US 6,173,242 B1
(45) Date of Patent: *Jan. 9, 2001

(54) CIRCUIT FOR SIMULATING A BREAK-OVER COMPONENT

(75) Inventor: Michaël Davy, Joue les Tours (FR)

(73) Assignee: SGS-Thomson Microelectronics S.A., Gentilly (FR)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/937,509

(22) Filed: Sep. 25, 1997

(30) Foreign Application Priority Data

Sep. 27, 1996 (FR) .................................... 96 12023

(51) Int. Cl.⁷ ........................................ G06F 17/50
(52) U.S. Cl. .......................... 703/14; 703/23; 307/125; 323/351
(58) Field of Search .................... 395/500.44, 500.34; 379/236; 307/125; 361/103; 364/802; 323/351; 703/6, 14, 23

(56) References Cited

U.S. PATENT DOCUMENTS

| | | | |
|---|---|---|---|
| 3,854,092 | | 12/1974 | Tani et al. .............................. 324/158 |
| 3,919,489 | * | 11/1975 | Schillo ................................... 379/236 |
| 4,117,527 | * | 9/1978 | Demarest et al. .................... 361/103 |
| 4,215,420 | * | 7/1980 | Kassakian ............................. 364/802 |
| 4,855,666 | * | 8/1989 | Jones ..................................... 323/351 |
| 5,619,081 | * | 4/1997 | Gershen et al. ...................... 307/125 |

OTHER PUBLICATIONS

French Search Report from French Patent Application 96 12023, filed Sep. 27, 1996.

Int. J. Of Electronics, vol. 70, No. 1, Jan. 1991, London, GB, Liang et al., "Transient Model For Gate Turn–Off Thyristor".

Instr. And Experimental Techniques, vol. 24, No. 2, Mar. 1981, Apr. 1981, New York, US, pp. 506–508, Belous et al., "Setup For Measuring The Field Effect In Semiconductors".

* cited by examiner

Primary Examiner—James P. Trammell
Assistant Examiner—Samuel Broda
(74) Attorney, Agent, or Firm—Wolf, Greenfield & Sacks, P.C.; James H. Morris; Theodore E. Galanthay

(57) ABSTRACT

The present invention relates to a circuit for simulating a break-over semiconductor component, including at least one switch simulating a switching function of the component and at least one voltage or current sensor controlling the switch, the sensor being associated with an adjustable check value corresponding to a characteristic value of the break-over component to be simulated by the circuit.

40 Claims, 4 Drawing Sheets

CIRCUIT FOR SIMULATING A BREAK-OVER COMPONENT

BACKGROUND OF THE INVENTION

1. Field of the Invention

The present invention relates to the implementation of a circuit for simulating the electrical characteristics of a so-called "break-over" component. A break-over component, for example a one- or two-way Shockley diode, a thyristor or a triac, is characterized by a discontinuity in its current-voltage characteristic.

2. Discussion of the Related Art

FIGS. 1 and 2 show, respectively, an equivalent circuit of a Shockley diode and its current-voltage characteristic.

A one-way Shockley diode can be broken up, functionally, into a thyristor Th associated with a Zener diode DZ. The Zener diode connects the gate of the thyristor to its anode.

FIG. 2 illustrates the current-voltage characteristic of a Shockley diode. This characteristic shows the relationship between the current I running through the circuit of FIG. 1 as a function of the voltage $V_{KA}$ between the cathode terminal K and the anode terminal A. It is assumed that the thyristor is initially blocked (non-conducting) and that voltage $V_{KA}$ starts increasing from a zero value. As long as voltage $V_{KA}$ has not reached the avalanche voltage $V_BR$ of Zener diode DZ, current I is zero (neglecting any leakage). Once voltage $V_{BR}$ is reached, the current increases linearly until thyristor Th triggers. This triggering happens at a so-called "break-over" operating point, for a voltage Vbo and a current Ibo. From this point, thyristor Th is on and voltage $V_{KA}$ across it becomes very low. The slope of the current variation in this operating range corresponds to the voltage drop in the thyristor in the on-state.

Once current I reaches, as it decreases, an on-state holding current Ih of the thyristor, the thyristor becomes non-conducting. This new non-conduction of the thyristor corresponds to the zero current portion of the characteristic.

A current-voltage characteristic of a thyristor or of a triac in its positive voltage and current quadrant is substantially similar to that of a Shockley diode.

A difference is that, for a thyristor or a triac to trigger, the gate current must further be higher than a given threshold Igt. Conventionally, the locking current is generally designated with symbol Il.

A problem appears when a break-over component is desired to be tested. In particular, when it is desired to determine the characteristic parameters (Ih, Il, Igt, Ibo and Vbo and other) of a new type of break-over component, a tester is used to measure the different triggering thresholds. The tester includes several current and voltage sources for supplying the component to be tested. In the case of a break-over component test, the tester is generally driven by a computer program determining a testing wave. For a Shockley diode, such a wave includes a period during which the voltage increases to detect a current variation and, thus, voltage $V_{BR}$, the break-over point Ibo–Vbo and other characteristic predetermined operating points. After, the wave decreases to cause a decrease of the current through the Shockley diode, in order to detect the holding current Ih. The current and voltage peaks of the testing wave may reach values of several hundreds of amperes and volts. The accuracy of the current and of the voltage provided by the testing device may undergo variations, as well as there may be areas of discontinuity of the current or voltage. This occurs, for example, upon a changing of range corresponding to a switching between different voltage and/or current sources of the tester.

Resistors are generally used to calibrate the current and voltage sources as well as the measuring circuits of the tester. If such a calibration method effectively ensures that the voltage and current sources can operate without discontinuities with a linear relation, it does not enable checking of the operation of the tester in the mode which will be used to test a break-over component. Indeed, by means of a resistive load, the operation of the sensor cannot be checked during the switchings which are necessary in the operation of a break-over component. Further, the programs used to produce a linear current or voltage are not the same as those which condition the shape of the testing wave of a break-over component. To be properly checked, a tester has to be operated in the same conditions as on the component to be tested.

However, it is not possible to use a standard break-over component to check the operation of the tester. Indeed, the holding current Ih varies from one component to another and during operation, especially, according to the testing wave which is applied across the component. This is actually the reason why the characteristic parameters of a Shockley diode or of a triac are given for a determined testing wave and as maximum and minimum values for a given type of component.

Besides, a multitude of standard components should be available to check the operation of the tester in an entire range of currents and voltages.

SUMMARY OF THE INVENTION

The present invention aims at solving the problems of calibration and checking of a break-over component tester.

The present invention especially aims at enabling a calibration and a checking of the tester in operating conditions implementing the same circuits as those which will be used in the effective testing of break-over components.

The present invention also aims at enabling the calibration and the checking of the tester in a wide range of currents and voltages.

To achieve these and other objects, the present invention provides a circuit for simulating a break-over semiconductor component, including at least one switch simulating a switching function of the component and at least one voltage or current sensor controlling the switch, the sensor being associated with an adjustable check value corresponding to a characteristic value of the break-over component to be simulated by the circuit.

According to an embodiment of the present invention, the closing of the switch is controlled by at least one first sensor and the opening of the switch is controlled by a second sensor.

According to an embodiment of the present invention, the switch is connected in series with at least one current sensor between terminals to which a power signal is to be applied.

According to an embodiment of the present invention applied to simulating a Shockley diode, the current sensor controls the opening of the switch, a sensor of a voltage across the switch controlling the closing of the switch.

According to an embodiment of the present invention applied to simulating a triac, the simulation circuit includes a switch connected in series between two terminals to which a power signal is to be applied, a first sensor of a control current applied on a control terminal, a second current sensor interposed between one of the power terminals and the switch, and a third current sensor connected in series with the second sensor, the switch being operated under the combined action of the first and second sensors.

According to an embodiment of the present invention, the second and third sensors are contained within a same current sensor having two check values.

According to an embodiment of the present invention applied to simulating the control of a triac, the sensor is formed by a voltage sensor between a control terminal and a first terminal to which a power signal is to be applied, the sensor controlling the closing of the switch and a variable resistor being connected between the control terminal and the first power terminal.

According to an embodiment of the present invention, the switch comprises a MOS power transistor.

According to an embodiment of the present invention, the switch comprises a thyristor.

According to an embodiment of the present invention, the at least one voltage or current sensor is formed by a comparator assembly based on an operational amplifier.

These objects, characteristics and advantages as well as others, of the present invention, will be discussed in detail in the following non-limiting description of specific embodiments of the present invention, in relation with the accompanying drawings.

DETAILED DESCRIPTION

Figure 5:
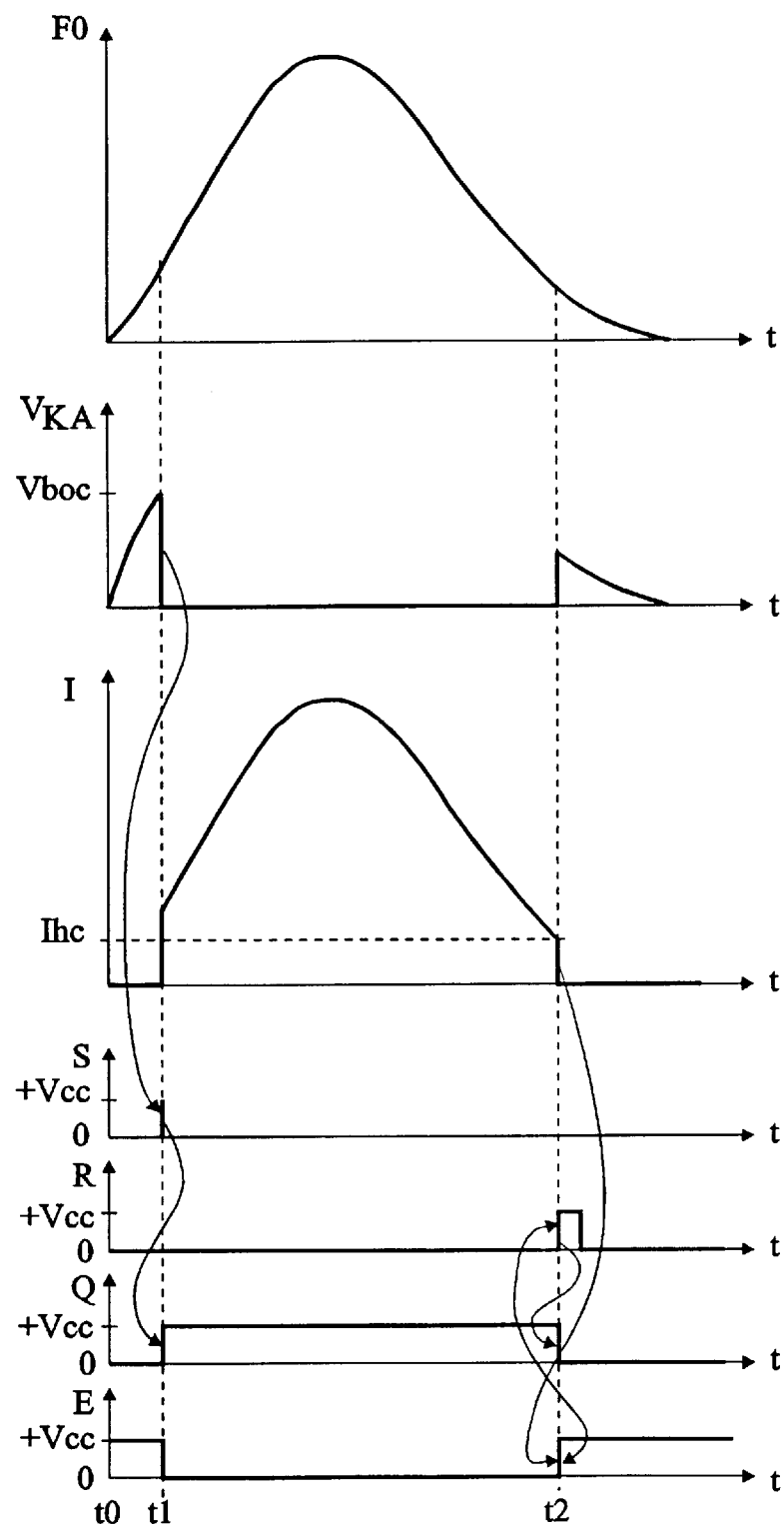
FIG. 5 illustrates, in the form of timing diagrams, the operation of the circuit shown in FIG. 4.

For clarity, only the components of the simulation circuit which are necessary for the understanding of the present invention have been shown in the drawings. For the same reasons, the timing diagrams of FIG. 5 are not to scale.

Figure 1:
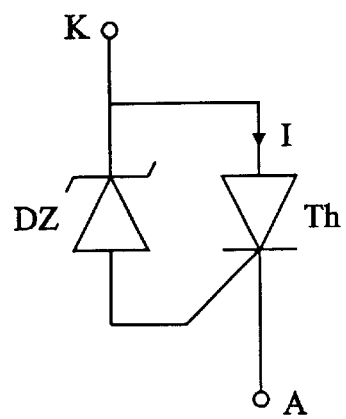
FIGS. 1 and 2, which have been previously described, are meant to show the state of the art and the problem to solve.
Figure 2:
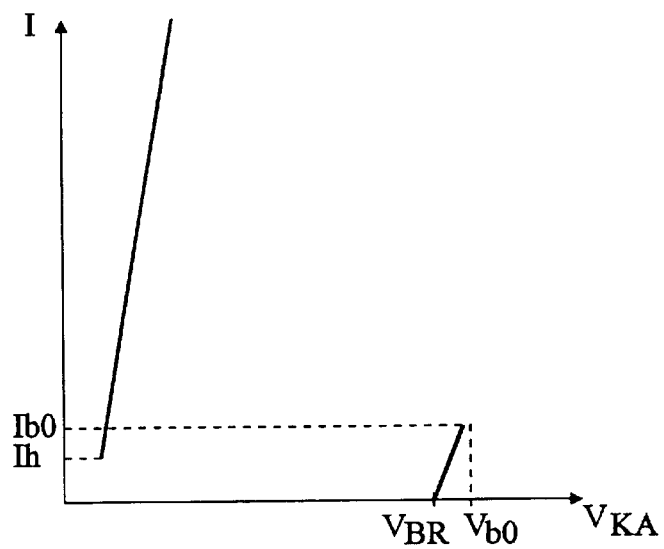
Figure 3:
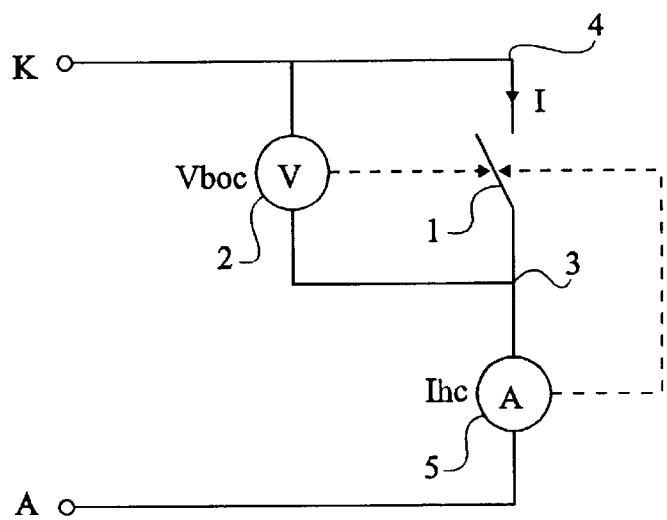
FIG. 3 shows a functional diagram of an embodiment of a circuit for simulating the operation of a Shockley diode according to the present invention.
Figure 4:
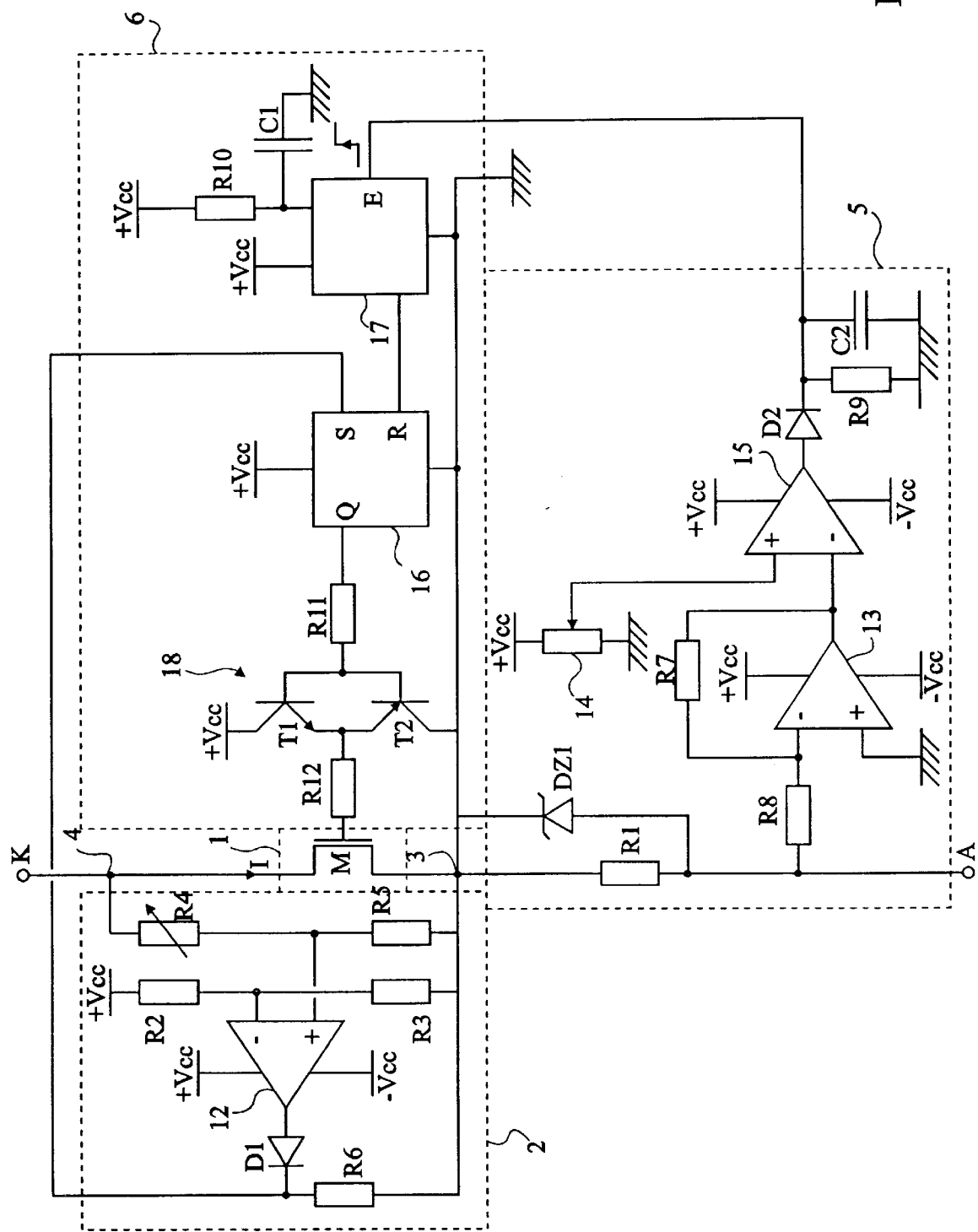
FIG. 4 shows a detailed embodiment of a circuit for simulating a Shockley diode such as shown in FIG. 3.

FIGS. 3 and 4 show, respectively in the form of a functional circuit and in the form of a detailed diagram, an embodiment of a circuit for simulating a Shockley diode according to the present invention. This circuit is meant to calibrate and/or to check the operation of a device (not shown) for testing break-over components and in its operating mode is meant to determine the holding current Ih of the component being tested.

According to the present invention, the circuit shown in FIG. 3 includes two terminals A and K respectively representing the anode and the cathode of the Shockley diode simulated by the circuit. Terminals A and K are meant to be connected to a tester which is desired to be calibrated or the operation of which is desired to be checked. Terminals A and K are, within the circuit, interconnected via switch 1 symbolizing the switching function of the Shockley diode. Switch 1 is controlled to be closed by a voltage sensor 2 measuring the voltage between terminals 3 and 4 of switch 1. The function of voltage sensor 2 is to cause the closing of switch 1 when the voltage across it exceeds a threshold value Vboc. A current sensor 5 is interposed between terminal A and a first terminal 3 of switch 1, the second terminal 4 of switch 1 being connected to terminal K. Current sensor 5 is meant to cause the opening of switch 1 when current I flowing through switch 1 becomes lower than a threshold Ihc.

When a determined wave is applied between terminals K and A, voltage $V_{KA}$ increases until it reaches threshold Vboc of sensor 2. At this time, switch 1 closes. Current I then increases up to the maximum current of the waveform, then decreases. When current I reaches detection threshold Ihc of sensor 5, switch 1 opens.

According to the present invention, the values of thresholds Ihc and Vboc are settable to have holding current Ih and break-over voltage Vbo of the Shockley diode so simulated vary.

By comparing check values Ihc and Vboc of the standard circuit with the values produced by the tester after the application of the testing wave, a possible dysfunction of the testing device can be identified. The circuit shown in FIG. 3 especially enables checking of the proper operation of the power generators, and then of the measuring circuits of the tester in Shockley diode testing mode.

Since the holding current and break-over voltage checks are settable, the same simulation circuit can simulate different Shockley diodes characterized by their respective holding current and break-over voltage.

FIG. 4 shows a detailed embodiment of a simulation circuit of a Shockley diode such as shown in FIG. 3.

According to this embodiment, switch 1 is formed by a MOS power transistor M, the drain of which is connected to terminal K and the source of which is connected, via a resistor R1 of low value, to terminal A.

Voltage sensor 2 is formed by an operational amplifier 12 configured as a comparator. An inverting input of amplifier 12 receives a reference voltage via a voltage dividing bridge formed by two resistors R2 and R3, having the same value, connected in series between a positive terminal +Vcc for supplying the circuit and the ground. The non-inverting input is thus at potential Vcc/2. A non-inverting input of amplifier 12 is connected to the midpoint of a voltage dividing bridge formed by two resistors R4 and R5 connected in series between terminal 4 of switch 1 and the ground. Resistor R4 is, according to the present invention, a variable resistor enabling the setting of the value Vboc constituting the closing threshold of switch 1. An output of amplifier 12 provides, via a diode D1 having its cathode connected to the ground via a resistor R6 of high value, a logic level to a circuit 6 for controlling the switch. Circuit 6 will be described hereafter and its operation will be better understood in relation with FIG. 5.

Current sensor 5 is also implemented based on an operational amplifier 15 mounted as a comparator. A non-inverting input of amplifier 15 receives, by means of a linear potentiometer 14 connected between terminal +Vcc and the ground, a threshold voltage corresponding to check current Ihc. An inverting input of amplifier 15 is connected to an output of an operational amplifier 13, mounted as a current/voltage converter. A non-inverting input of amplifier 13 is grounded. An inverting input of amplifier 13 is connected, via a resistor R7, to its output. This inverting input is also connected, via a resistor R8, to terminal A. Resistor R1 acts as a resistor for measuring the current I flowing through switch 1. Preferably, resistance R7 is much higher than resistance R8 to amplify the sensed current and to thus improve the resolution of sensor 5. An output of amplifier 15 provides, via a diode D2 having its cathode grounded by means of a resistor R9 of high value, a logic level to circuit 6.

Amplifiers 12, 13, and 15 are, preferably, supplied symmetrically between potentials +Vcc and −Vcc (for example, +12 volts and −12 volts).

Preferably, a Zener diode DZ1 is connected in parallel to resistor R1. The function of Zener diode DZ1 is to protect the input of amplifier 13 from the currents applied via terminals A and K, since these currents may reach peaks of several tens of amperes and then produce voltages exceeding the supply voltages of amplifier 13.

Circuit 6 for controlling transistor M includes an RS flip-flop 16 for interpreting the logic levels issued by comparators 12 and 15. A positioning input S is connected to the cathode of diode D1. A reset input R is connected, via a one-shot circuit 17, to the cathode of diode D2. Circuit 17 has the function of taking into account the level present on input S of flip-flop 16, after an opening of switch 1. One-shot 17 is triggered on a rising edge of its input signal (the logic level issued by comparator 15 on input E of circuit 17). The duration of the pulse that it issues is set by a resistor R10 and a capacitor C1 connected to a parametering input of circuit 17. Resistor R10 is connected between terminal +Vcc and this parametering input, and capacitor C1 is connected between this input and the ground. A non-inverting output Q of flip-flop 16 issues a control signal for switch 1. This signal passes through, preferably, an amplifying stage 18, based on bipolar transistors, the function of which is to help the switching of MOS transistor M by amplifying the output current of flip-flop 16. Stage 18 is formed by two bipolar transistors, respectively an NPN transistor T1 and a PNP transistor T2, connected in series between terminal +Vcc and the ground. The respective bases of transistors T1 and T2 are connected, via a resistor R11, to the output Q of flip-flop 16. The emitter of transistor T1 and the collector of transistor T2 are connected, via a resistor R12 of low value, to the gate of MOS transistor M.

RS flip-flop 16 and one-shot circuit 17 are supplied between potential +Vcc and the ground.

The operation of circuit 6 will be better understood with the description of FIG. 5. FIG. 5 shows, in the form of timing diagrams and for a testing wave FO issued by a tester, the respective shapes of voltage $V_{KA}$, of current I, of the logic levels of terminals S, R, and Q of flip-flop 16, and of the logic level of terminal E of one-shot 17.

Initially, transistor M is non-conducting. Between times t0 and t1, the voltage of wave FO starts increasing and voltage $V_{KA}$ follows the course of the wave. At time t1, when voltage $V_{KA}$ is such that the potential of the non-inverting terminal of amplifier 12 (set by variable resistance R4 as a function of the selected threshold Vboc) becomes higher than Vcc/2, the potential of terminal S switches to the high state (substantially +Vcc). Since terminal R is in the low state (ground), the potential of terminal Q switches from the ground to +Vcc. Transistor T1 turns on, which turns on transistor M. Current I then abruptly increases and starts following the course of wave FO. Simultaneously, voltage $V_{KA}$ becomes zero (neglecting the low voltage drop in resistor R8 and in transistor M in the conducting state) and the potential of terminal S becomes zero again. A current is now sensed by resistor R1. Assuming that threshold Ihc is lower than current Ibo, the output of comparator 15, which was up to then in the high state, also switches at time t1, causing a falling edge on terminal E. Current I increases to the maximum of wave FO, then decreases, always following the course of the testing wave. At a time t2, when current I is such that the potential of the inverting input of amplifier 15 becomes lower than the potential set by potentiometer 14 (corresponding to the selected threshold Ihc), the output of comparator 15 switches to potential +Vcc. The rising edge on terminal E triggers one-shot 17 which then issues to terminal R a pulse at potential +Vcc of a duration corresponding to the time constant set by resistor R10 and capacitor C1. The output Q of flip-flop 16 switches to the low state, which renders transistor T1 non-conducting and turns on transistor T2. Transistor M becomes non-conducting and current I disappears. Voltage $V_{KA}$ follows the end of testing wave FO. Since the pulse on input R of flip-flop 13 disappears rapidly, the circuit is ready again to receive a new testing wave. The time constant of circuit 17 (for example, 15 μs) is chosen to be lower than the minimum duration of a testing wave generated by the tester.

Preferably, a capacitor C2 is connected in parallel to resistor R9. This capacitor is used to slightly integrate the output of comparator 15 to avoid an untimely triggering of switch 1, due to a possible slight oscillation of current I, at the switching of transistor M.

Preferably, the circuit is supplied by means of a symmetrical regulated supply, because this supply conditions the accuracy of the check voltage set by potentiometer 10.

MOS transistor M is sized to be able to absorb a current corresponding to the peaks of the testing wave and must bear an avalanche voltage substantially higher than the maximum break-over voltage provided for the standard circuit.

As a particular example of implementation, the resistors and capacitors of the circuit shown in FIG. 4 can have the following values:

R1=0.3 Ω;
R2=R3=10 kΩ;
R4 is a variable resistance of 47 kΩ;
R5=R8=R11=1 kΩ;
R6=R9=22 kΩ;
R7=27 kΩ;
R10=2.2 kΩ;
R12=10 Ω;
C1=10 nF; and
C2=1 nF.

Figure 6:
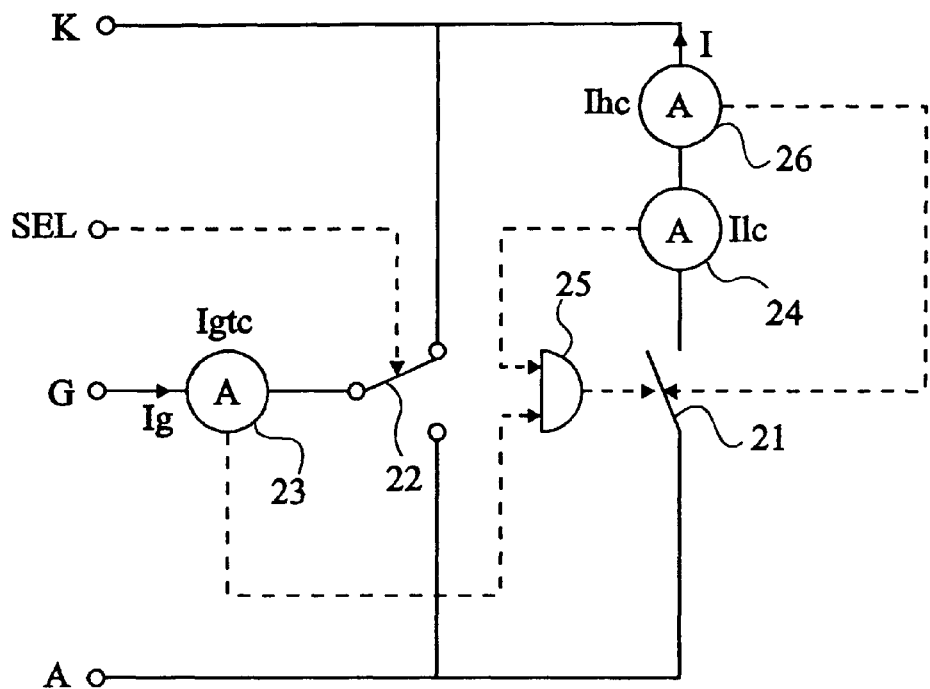
FIG. 6 shows a functional diagram of an embodiment of a circuit for simulating a triac meant to simulate holding and locking currents.

FIG. 6 shows a functional diagram of an embodiment of a circuit for simulating a triac according to the present invention. This circuit is meant to simulate the operation of the triac as concerns its locking current Il and its holding current Ih.

The circuit shown in FIG. 6 includes three terminals respectively representing anode A, cathode K, and gate G of the triac. The switching function is implemented by means of a switch 21.

A switch 22 enables, preferably, selection of the operating mode of the circuit between a mode where it simulates an anode-gate triac and an operating mode where it simulates a cathode-gate triac. This switch 22 is controlled from the outside of the circuit which includes a selection terminal SEL. Similarly, rectifying diodes (not shown) can be interposed between terminals A, K, and G and the rest of the circuit to enable the circuit to simulate the different operating quadrants of the triac.

Switch 21 is controlled, based on a detection of gate current Ig and of current I between terminals K and A, in response to a testing wave applied between these terminals. A current sensor 23 measures current Ig and controls the closing of switch 21 when current Ig becomes higher than a threshold Igtc. A sensor 24 compares current I with a locking current threshold Ilc. Switch 21 remains closed when current I is higher than threshold Ilc. A logic means 25 combines the signals issued by sensors 23 and 24 to control the closing of switch 21. A current sensor 26 is mounted in series with sensor 24 to cause the opening of switch 21 when current I becomes lower than a check value Ihc corresponding to the holding current. Sensors 24 and 26 may be combined into a single sensor, provided that the common sensor thus constituted has two triggering values. Values Igtc, Ilc, and Ihc are settable to enable to implement the desired standard by means of the circuit.

When a sufficient gate current is applied to the assembly, switch 21 closes during the gate current pulse. When current I of the testing wave is higher than threshold Ilc, switch 21 is maintained closed, thus simulating the triac in the triggered state. As soon as current I decreases enough to reach check value Ihc, switch 21 opens and the simulated triac is blocked. Switch 21 is, for example, a MOS power transistor.

When applied to a tester, a circuit such as shown in FIG. 6 enables checking of the proper operation of the power generators of the tester, in triac locking and holding current testing mode.

Figure 7:
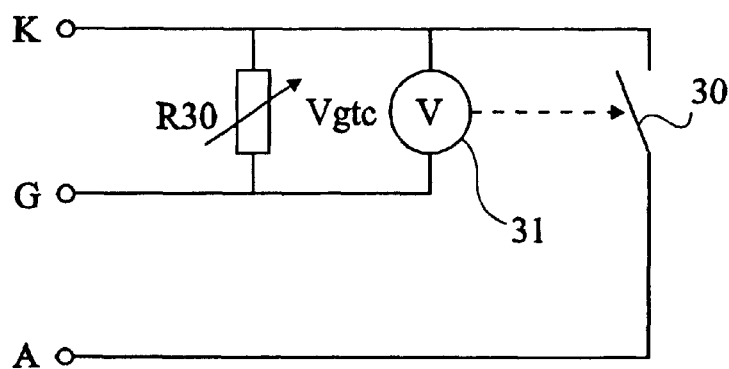
FIG. 7 shows a functional diagram of an embodiment of a circuit for simulating a triac meant to simulate a gate triggering current and voltage.

FIG. 7 shows a functional diagram of an embodiment of a circuit for simulating a triac meant to simulate the triggering of the triac as a function of the gate current. As previously, the circuit includes three input terminals, respectively an anode terminal A, a gate terminal G and a cathode terminal K. The switching function of the triac is simulated by a switch 30 interposed between terminals K and A. Terminal G is connected, via a variable resistor R30, to terminal K. Although not shown in FIG. 7, it should be noted that, like for the assembly of FIG. 6, the assembly can include a switch for selecting between an anode-gate triac and a cathode-gate triac as well as rectifying diodes. The voltage across resistor 30 is sensed by means of a sensor 31 which controls the closing of switch 30. The triggering threshold of sensor 31 is settable.

The assembly of FIG. 7 can operate in two different modes. In a first mode, the tester applies an increasing voltage on terminal G. Switch 30 is closed as soon as this voltage reaches threshold Vgtc of sensor 31. In a second operating mode, the tester applies a current in resistor R30. Resistor R30 forms, in association with threshold Vgtc, a check Igtc. The value of variable resistance R30 conditions the value of the gate current threshold Igtc of the simulation circuit. Switch 30 is, for example, a thyristor.

An assembly such as shown in FIG. 7 enables to check the tester generator(s) used for the control signals of a triac.

Of course, the present invention is likely to have various alterations, modifications, and improvements which will readily occur to those skilled in the art. In particular, the different check values can be set by digital means to automatically modify the standard values defined by the simulation circuit, in order to implement an automated checking procedure of the testing device.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for simulating a break-over semiconductor component, including:

at least one switch simulating a switching function of the component; and at least one voltage or current sensor controlling the switch, the sensor being associated with an adjustable check value corresponding to a characteristic value of the break-over component to be simulated by the circuit;

said at least one voltage or current sensor including a voltage sensor disposed in parallel to said switch to control the closing of said switch, and a current sensor disposed in series to said switch between terminals to which a power signal is to be applied to control the opening of said switch.

2. A simulation circuit according to claim 1, applied to simulating control of a triac, wherein the sensor is formed by a voltage sensor between a control terminal and a first terminal to which a power signal is to be applied, the sensor controlling the closing of the switch and a variable resistor being connected between the control terminal and the first power terminal.

3. A simulation circuit according to claim 2, wherein the switch comprises a thyristor.

4. A circuit for simulating a break-over semiconductor component, including:

at least one switch simulating a switching function of the component; and at least one voltage or current sensor controlling the switch, the sensor being associated with an adjustable check value corresponding to a characteristic value of the break-over component to be simulated by the circuit;

wherein closing of the switch is controlled by at least one first sensor and opening of the switch is controlled by a second sensor.

5. A circuit for simulating a break-over semiconductor component, including:

at least one switch simulating a switching function of the component; and at least one voltage or current sensor controlling the switch, the sensor being associated with an adjustable check value corresponding to a characteristic value of the break-over component to be simulated by the circuit;

wherein the switch is connected in series with at least one current sensor between terminals to which a power signal is to be applied.

6. A simulation circuit according to claim 5, applied to simulating a Shockley diode, wherein the current sensor controls the opening of the switch, a sensor of a voltage across the switch controlling the closing of the switch.

7. A simulation circuit according to claim 6, wherein the switch comprises a MOS power transistor.

8. A circuit for simulating a triac, including:

a switch simulating a switching function of the triac and connected in series between two terminals to which a power signal is to be applied; a first sensor of a control current applied on a control terminal;

a second current sensor, interposed between one of the power terminals and the switch, the switch being operated under a combined action of the first and second sensors; and a third current sensor, connected in series with the second sensor.

9. A simulation circuit according to claim 8, wherein the second and third sensors are contained within a same current sensor having two check values.

10. A simulation circuit according to claim 8, wherein the switch comprises a MOS power transistor.

11. A circuit for simulating a break-over semiconductor component, including:
   at least one switch simulating a switching function of the component; and
   at least one voltage or current sensor controlling the switch, the sensor being associated with an adjustable check value corresponding to a characteristic value of the break-over component to be simulated by the circuit;
   wherein the at least one voltage or current sensor is formed by a comparator assembly based on an operational amplifier.

12. A circuit for simulating the electrical characteristics of a break-over component, said circuit comprising:
   a switch for simulating a switching function of the components;
   power signal terminals, at least one of which is coupled to said switch;
   a voltage sensor coupled across said switch for measuring the voltage across said switch and causing a closing of the switch when said voltage exceeds a predetermined threshold voltage value;
   and a current sensor coupled in series with said switch for measuring the current through said switch and causing an opening of the switch when said current becomes lower than a predetermined threshold current value;
   said predetermined threshold values corresponding to characteristic values of the break-over component to be simulated by the circuit.

13. A simulation circuit according to claim 12 wherein said predetermined threshold voltage value is Vboc.

14. A simulation circuit according to claim 12 wherein said predetermined threshold current value is Ihc, and said current sensor has a component that enables setting of the value Ihc.

15. A simulation circuit according to claim 12 wherein said switch compresses a MOS power transistor.

16. A simulation circuit according to claim 12 wherein said switch comprises a thyristor.

17. A simulation circuit according to claim 12 wherein said voltage sensor comprises a comparator.

18. A simulation circuit according to claim 17 wherein said comparator includes an operational amplifier.

19. A simulation circuit according to claim 17 wherein said current comprises a comparator.

20. A simulation circuit according to claim 19 wherein said current sensor comparator includes an operational amplifier.

21. A simulation circuit according to claim 12, as applied to simulating a Shockley diode, wherein the current sensor controls opening of the switch at Ihc.

22. A simulation circuit according to claim 21 wherein the voltage sensor controls closing of the switch at Vboc.

23. A circuit for simulating the electrical characteristics of a break-over component, said circuit comprising:
   a switch means for simulating a switching function of the component;
   power signal terminals;
   a voltage sensing means;
   means coupling the voltage sensing means in parallel with said switch means for measuring the voltage across said switch means and causing a closing of the switch means when said voltage exceeds a predetermined threshold voltage value;
   a current sensing means;
   and means coupling the current sensing means in a series circuit with said switch means between said power signal terminal for measuring the current through said switch means and causing an opening of the switch means when said current becomes lower than a predetermined threshold current value;
   said predetermined threshold values corresponding to characteristic values of the break-over component to be simulated by the circuit.

24. A simulation circuit according to claim 23 wherein said predetermined threshold voltage value is Vboc.

25. A simulation circuit according to claim 23 wherein said predetermined threshold current value is Ihc, and said current sensor has a component that enables setting of the value Ihc.

26. A simulation circuit according to claim 23 wherein said switch means compresses a MOS power transistor.

27. A simulation circuit according to claim 23 wherein said switch comprises a thyristor.

28. A simulation circuit according to claim 23 wherein said voltage sensing means comprises a comparator means.

29. A simulation circuit according to claim 28 wherein said comparator means includes an operational amplifier means.

30. A simulation circuit according to claim 28 wherein said current sensing means comprises a comparator means.

31. A simulation circuit according to claim 30 wherein said current sensing means comparator includes an operational amplifier means.

32. A simulation circuit according to claim 23, as applied to simulating a Shockley diode, wherein the current sensing means controls opening of the switch means at Ihc.

33. A simulation circuit according to claim 32 wherein the voltage sensing means controls closing of the switch means at Vboc.

34. A circuit for simulating the electrical characteristics of a triac, said circuit comprising:
   a switch for simulating a switching function of the triac;
   power signal terminals to which a power signal is to be applied;
   said switch being coupled in series between said power signal terminal;
   a control terminal;
   a first sensor coupled from said control terminal and for sensing a control current applied to said control terminal;
   and a second sensor, interposed between one of the power signal terminal and the switch;
   said switch being operated under a combined action of the first and second sensors.

35. A simulation circuit according to claim 34 wherein said switch comprises a MOS power transistor.

36. A circuit for simulating the electrical characteristics of a triac, said circuit comprising:
   a switch for simulating a switching function of the triac;
   power signal terminals to which a power signal is to be applied;
   said switch being coupled in series between said power signal terminal; a control terminal;
   a first sensor coupled from said control terminal and for sensing a control current applied to said control terminal;

and a second sensor, interposed between one of the power signal terminal and the switch;

said switch being operated under a combined action of the first and second sensors;

including a third sensor coupled in series with the second sensor.

37. A simulation circuit according to claim 36 wherein said second and third sensors are both current sensors.

38. A simulation circuit according to claim 37 wherein the second and third sensors are contained within a same curent sensor member having two check values.

39. A circuit for simulating the electrical characteristics and control of a triac, said circuit comprising:

a switch for simulating a switching function of the triac;

power signal terminals to which a power signal is to be applied;

said switch being coupled in series between said power signal terminal;

a control terminal;

a voltage sensor coupled between said control terminal and one of said power signal terminal;

said voltage sensor controlling the closing of the switch;

and a variable resistor coupled between said control terminal and said one of said power terminals.

40. A simulation circuit according to claim 39 wherein said switch comprises a thyristor.

* * * * *